United States Patent
Chen et al.

(10) Patent No.: US 8,158,456 B2
(45) Date of Patent: Apr. 17, 2012

(54) METHOD OF FORMING STACKED DIES

(75) Inventors: Ming-Fa Chen, Taichung (TW);
Chen-Shien Chen, Zhubei (TW);
Wen-Chih Chiu, Miaoli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 89 days.

(21) Appl. No.: 12/329,341

(22) Filed: Dec. 5, 2008

(65) Prior Publication Data
US 2010/0144094 A1 Jun. 10, 2010

(51) Int. Cl.
*H01L 21/02* (2006.01)
(52) U.S. Cl. ........ 438/109; 438/459; 438/614; 438/620; 257/E21.002
(58) Field of Classification Search .................. 438/614, 438/620, 109, 459
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,119,428 B2 | 10/2006 | Tanie et al. |
| 7,122,912 B2 | 10/2006 | Matsui |
| 7,157,787 B2 | 1/2007 | Kim et al. |
| 7,193,308 B2 | 3/2007 | Matsui |
| 7,241,675 B2 | 7/2007 | Savastiouk et al. |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |

*Primary Examiner* — Alexander Ghyka
(74) *Attorney, Agent, or Firm* — Slater & Matsil, L.L.P.

(57) ABSTRACT

The formation of through silicon vias (TSVs) in an integrated circuit (IC) die or wafer is described in which the TSV is formed in the integration process prior to metallization processing. TSVs may be fabricated with increased aspect ratio, extending deeper in a wafer substrate. The method generally reduces the risk of overly-thinning a wafer substrate in a wafer back-side grinding process typically used to expose and make electrical contacts to the TSVs. By providing deeper TSVs and bonding pads, individual wafers and dies may be bonded directly between the TSVs and bonding pads on an additional wafer.

20 Claims, 19 Drawing Sheets

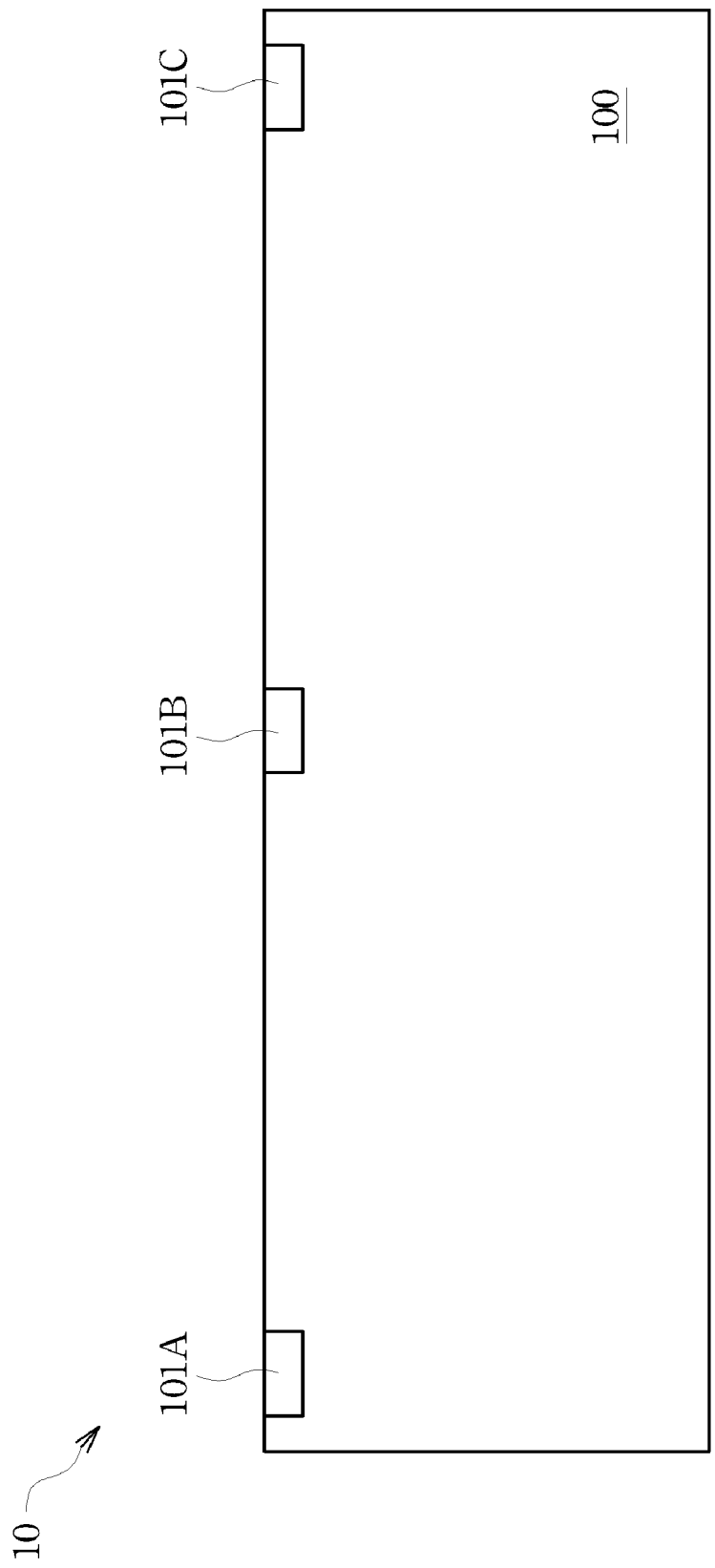

METHOD OF FORMING STACKED DIES

TECHNICAL FIELD

The present invention relates generally to integrated circuit fabrication, and more particularly to a method of forming stacked dies having one or more through-silicon vias.

BACKGROUND

Generally, the speed at which an integrated circuit operates is influenced by the distance between the farthest separated components that communicate with each other on the chip. Laying out circuits as three-dimensional structures has been shown to significantly reduce the communication path length between on-chip components, provided the vertical distances between the layers are much smaller than the chip width of the individual layers. Thus, by stacking circuit layers vertically, the overall chip speed is typically increased. One method that has been used to implement such stacking is through wafer bonding.

Wafer bonding is the joining together of two or more semiconductor wafers on which integrated circuitry has been formed. Wafers are typically joined by direct bonding of external oxide layers or by adding adhesives to interlayer dielectric (ILD) layers. The bonded result produces a three-dimensional wafer stack which is subsequently diced into separate "stacked dies", with each individual stacked die having multiple layers of integrated circuitry. In addition to the increased speed that the three-dimensional circuitry typically experiences, wafer stacking offers other potential benefits, including improved form factors, lower costs, and greater integration through system-on-chip (SOC) solutions. In order to enable the various components integrated within each stacked die, electrical connections are provided that provide conductors between vertical layers. Through silicon vias (TSVs) are typically fabricated to provide vias filled with a conducting material that passes completely through the layer to contact and connect with the other TSVs and conductors of the bonded layers.

In an existing TSV formation process, TSVs are formed after the CMOS device formation in a wafer substrate or even after the top metallization process. One disadvantage of forming TSVs after the CMOS process or metallization process is that the density of vias is typically less because of etch and design limitations. Etching through metallization layers does not typically result in a recess that would allow for a particularly dense TSV. Moreover, again because the process etches through metallization and contact regions, the design of the via is limited based on the existing structures of the metallization layers and contact regions. Thus, designers will typically have to design the TSV network around the existing metal layers and contact traces. This limited design and density potentially creates connection, contact, and reliability problems.

A further limitation to the existing TSV formation process is the limited depth to which TSVs may be formed in a wafer substrate. Due to the existing structures of the metallization layers, an etch process typically employed to form TSV openings in a wafer substrate proceeds in a wafer substrate to a limited depth that is significantly less than a substrate thickness. As an example, a typical plasma etch process may be used to form TSV openings with depth of from about 25 to about 50 microns, compared with a typical silicon wafer substrate of about 700 microns. Back grinding is typically used in thinning the wafer substrate to a thickness of less than 100 microns, and exposing the TSVs in order to connect stacked dies. However, this practice may significantly reduce the mechanical strength of a wafer substrate as a solid foundation for the integrated circuit (IC) formed thereon. Moreover, an overly-thinned wafer substrate is prone to breakage, thus significantly impacting the overall IC product yield.

SUMMARY OF THE INVENTION

These and other problems are generally solved or circumvented, and technical advantages are generally achieved, by preferred embodiments of the present invention which provide for the formation of TSVs prior to metallization processing. TSVs may be fabricated with increased aspect ratio, extending deeper in a wafer substrate. The method generally reduces the risks of overly-thinning a wafer substrate in a wafer back-side grinding process typically used to expose and make electrical contacts to the TSVs. By providing deeper TSVs and bonding pads, individual wafers and dies may be bonded directly between the TSVs and bonding pads on an additional wafer.

In accordance with a preferred embodiment of the present invention, a method of fabricating a stacked integrated circuit (IC) semiconductor die comprises the steps of forming one or more recesses in a first semiconductor wafer, filling the one or more recesses with conducting material to form one or more through-silicon vias in the first semiconductor wafer, forming one or more bonding contacts on a front-side of the first semiconductor wafer, attaching the front-side of the first semiconductor wafer to a wafer carrier, exposing a back-side of the first semiconductor wafer, thinning the back-side of the first semiconductor wafer until the one or more through-silicon vias are exposed and slightly protrude the back-side, and aligning and bonding the one or more through-silicon vias with corresponding one or more bonding contacts on one or more bonding surfaces on a second semiconductor die.

In accordance with another preferred embodiment of the present invention, a method of fabricating a stacked integrated circuit (IC) semiconductor die comprises the steps of providing a first semiconductor wafer having one or more through-silicon vias formed in a substrate, attaching a front-side surface of the first semiconductor wafer to a wafer carrier, exposing a back-side of the first semiconductor wafer, thinning the back-side of the first semiconductor wafer until the one or more through-silicon vias are exposed and slightly protrude the back-side, forming one or more first bonding contacts in a metallization insulator layer over the thinned back-side of the first semiconductor wafer, the one or more first bonding contacts being electrically coupled to the one or more through-silicon vias, providing a second semiconductor work-piece having one or more second bonding contacts on a bonding surface of the second semiconductor die, and aligning and bonding the one or more first bonding contacts on the first semiconductor wafer to the corresponding one or more second bonding contacts on the second semiconductor workpiece.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1M are cross-sectional views of a wafer having through vias formed according to one embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1B:
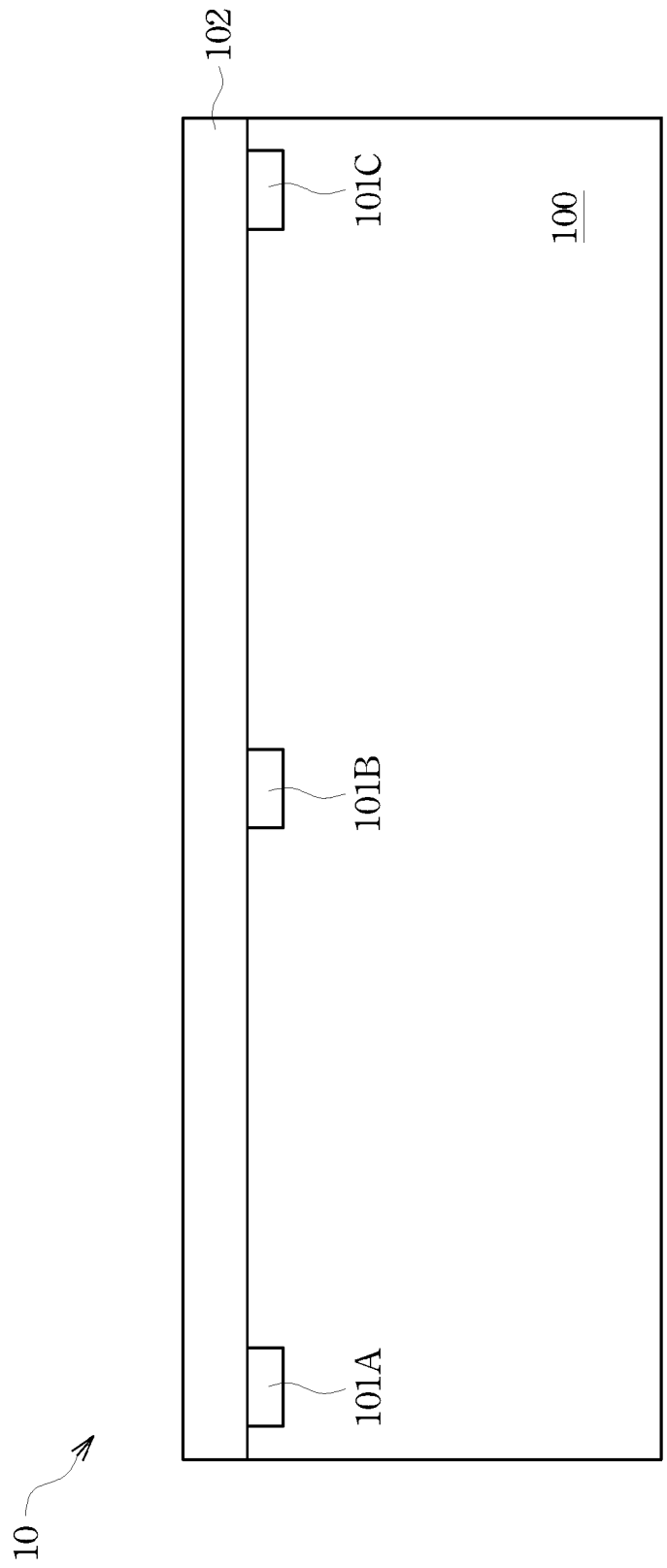
Figure 1C:
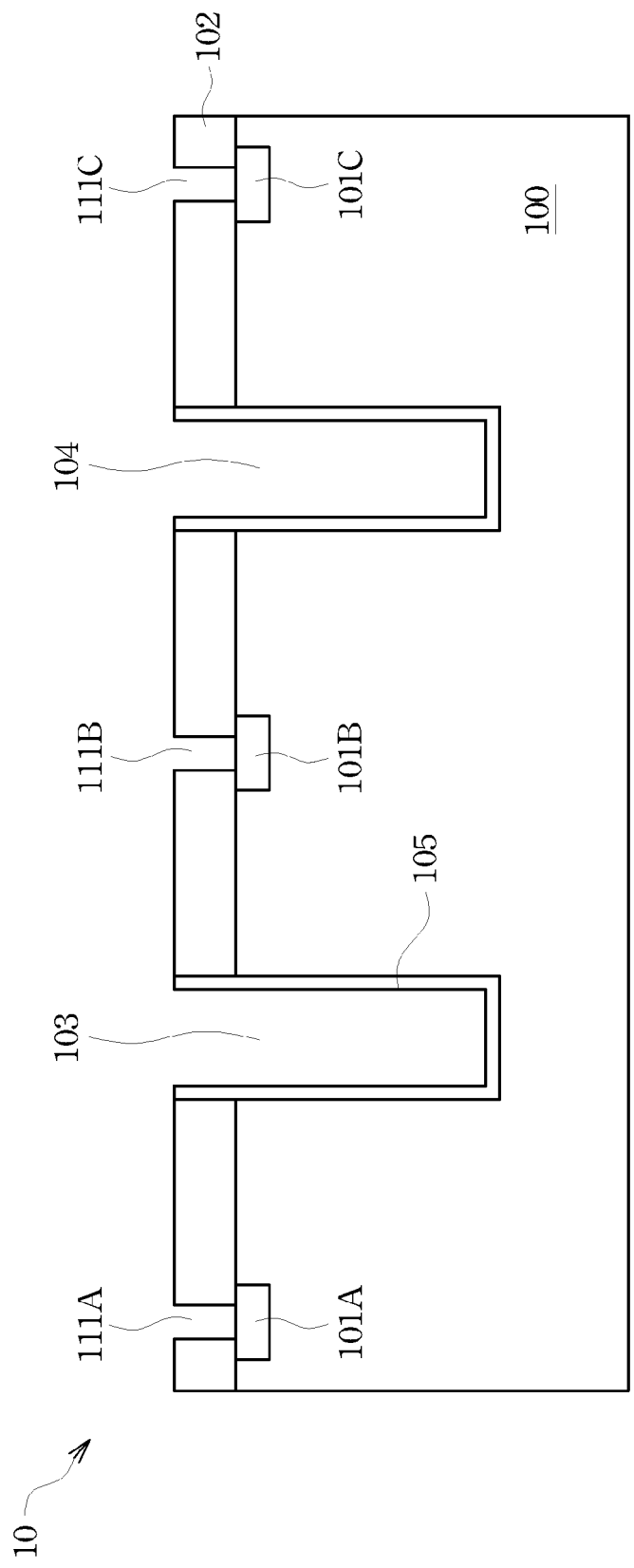

With reference now to FIG. 1A, there is shown a cross-sectional diagram of wafer 10. Wafer 10 comprises substrate 100, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates devices 101A, 101B, and 101C processed in substrate 100. In FIG. 1B, insulating layer (also sometimes referred to as inter-layer dielectric or ILD layer) 102 is deposited on substrate 100 of wafer 10. Examples of such insulating material include silicon dioxide and phosphosilicate glass (PSG). Etching is performed on wafer 10 to create through-silicon-via (TSV) recesses 103 and 104, and contact openings 111A, 111B, and 111C in ILD layer 102, as shown in FIG. 1C. In order to prevent any conducting material from leaching into any active portions of the circuitry of wafer 10, liner dielectric 105, such as silicon nitride, is deposited in a conformal layer over wafer 10, including TSV recesses 103 and 104. In one preferred embodiment, TSV recesses 103 and 104 each has a dimension (e.g., diameter) from about 5 microns to about 50 microns and an aspect ratio from about 12:1 to about 3:1.

Figure 1D:
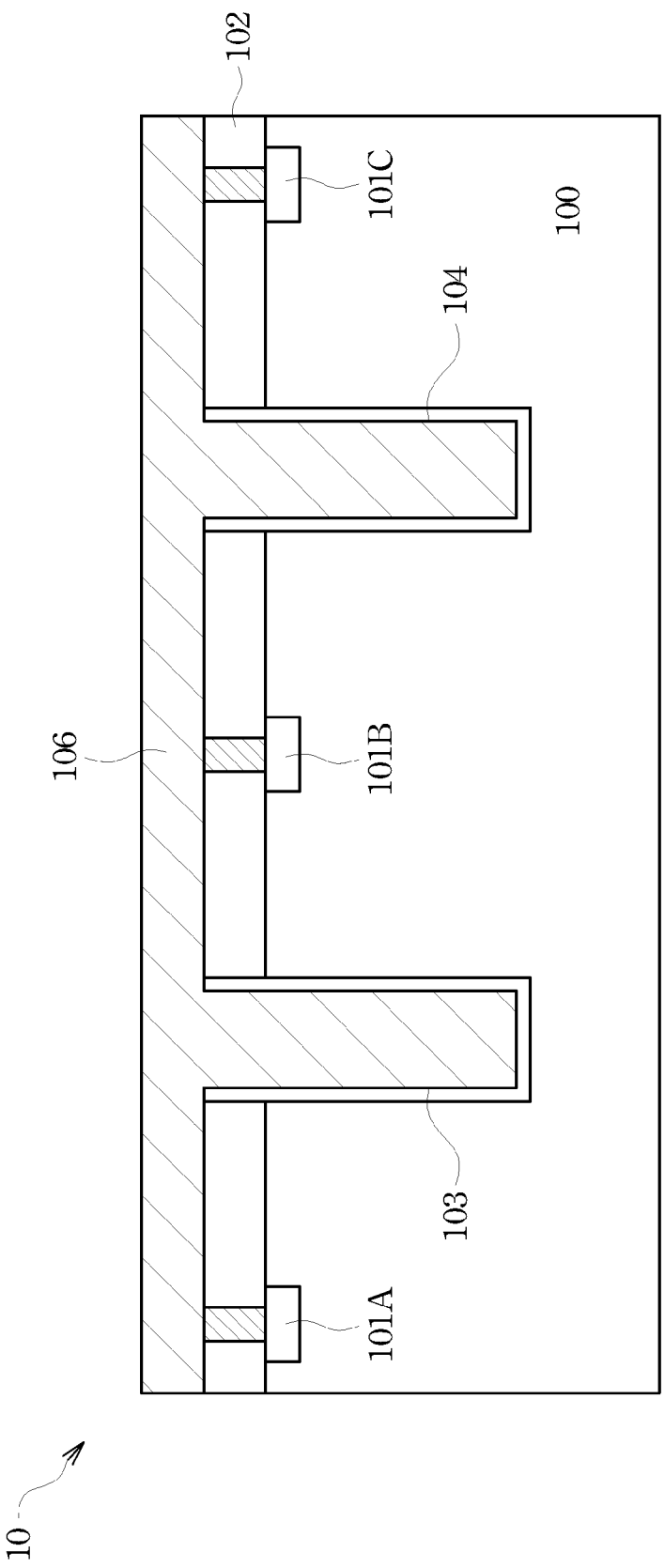
Figure 1E:
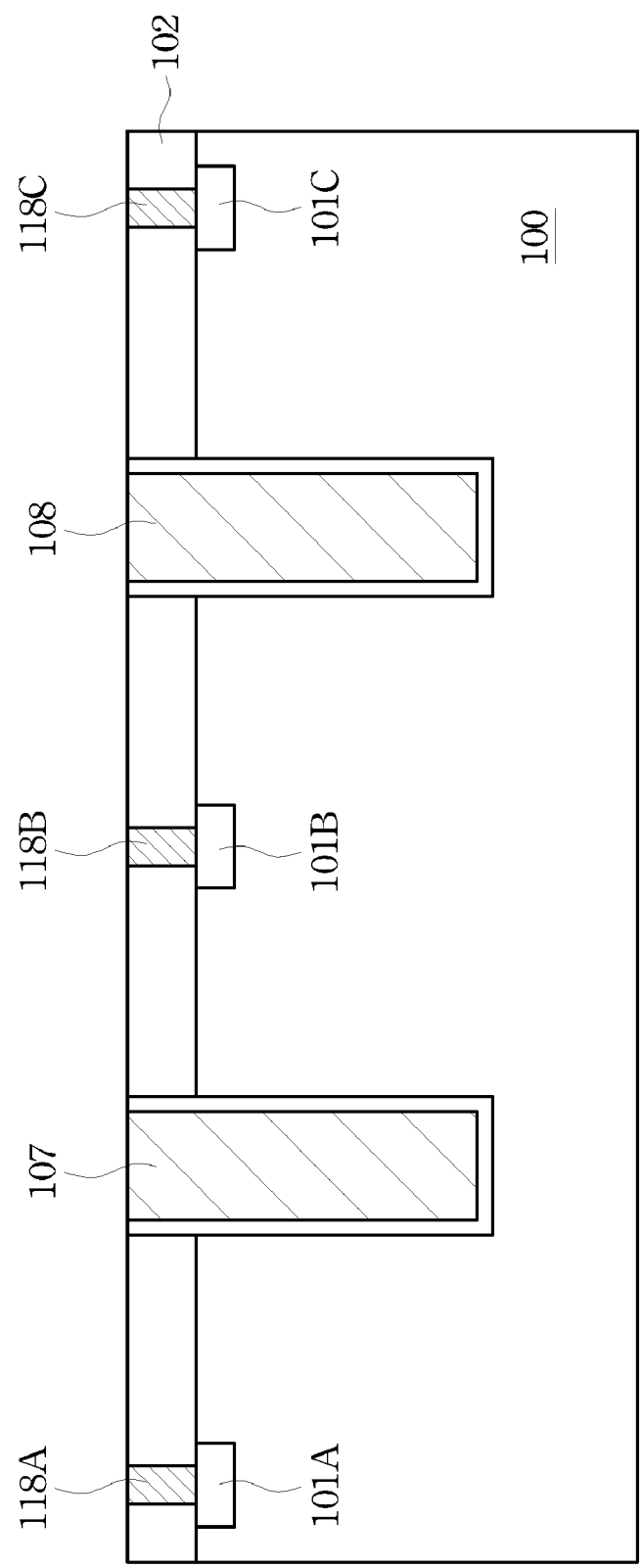

A layer of conducting material, conductor 106, is deposited onto wafer 10, as shown in FIG. 1D. The conducting material may comprise various materials, such as copper, tungsten, aluminum, gold, silver, and the like. Conductor 106 fills TSV recesses 103 and 104, and contact openings 111A, 111B, and 111C. After removing the excess portions of conductor 106, either through etching, chemical mechanical polishing (CMP), or the like, wafer 10 now comprises contacts 118A, 118B, and 118C in ILD layer 102 and TSVs 107 and 108, which are simultaneously formed in substrate 100 and ILD layer 102, as shown in FIG. 1E.

In another embodiment, contacts 118A, 118B, and 118C may be formed prior to the formation of TSVs 107 and 108. In additional and/or alternative embodiment, contacts 118A, 118B, and 118C may be formed after the formation of TSVs 107 and 108.

Figure 1F:
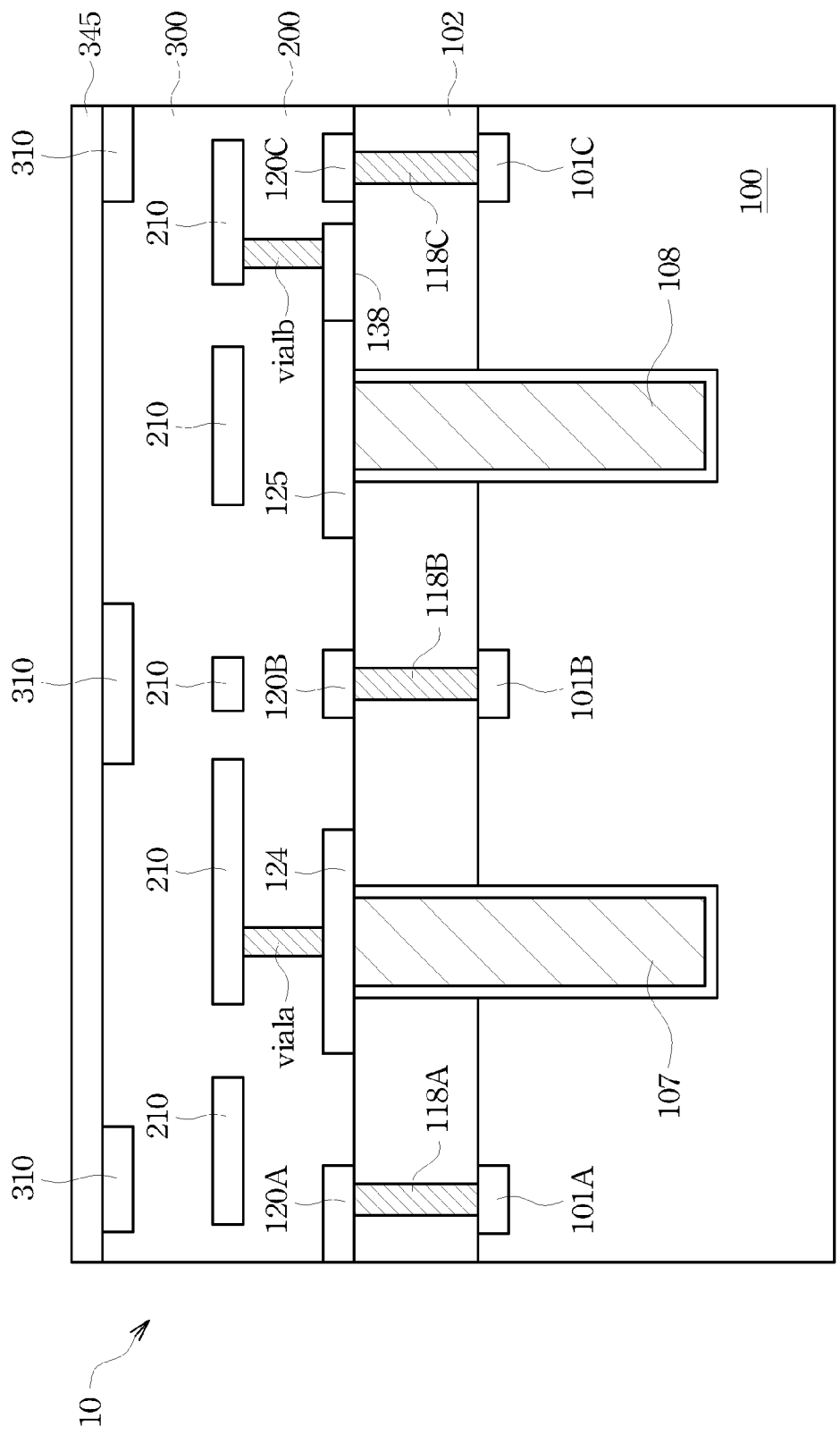

Continuing in FIG. 1F, through a typical back-end-of-line (BEOL) process flow used in an IC fabrication process, a first interconnect layer (M1 layer) is deposited and patterned on wafer 10, forming first interconnect traces 120A-120C coupled to devices 101A-101C through contacts 118A-118C, respectively, and forming contact pads 124 and 125 coupled to TSVs 107 and 108, respectively. A first inter-metal dielectric layer (IMD) 200 is deposited on wafer 10. A second interconnect layer (M2 layer) is deposited and patterned on wafer 10, forming interconnect traces 210 through existing techniques, such as a dual damascene process. In a similar manner, interconnect traces 310 are formed in a third interconnect layer (M3 layer) overlying the interconnect traces 210 in the second interconnect layer, separated by second IMD layer 300. The process of forming the interconnect structure on wafer 10 may continue in the upper interconnect layers until the desired interconnections between the various devices and features in wafer 10 are made. Conducting material used for the interconnect traces in the various interconnect layers may comprise various materials, such as copper, tungsten, aluminum, gold, silver, and the like. It is noted that vias are typically used to couple the TSVs 107 and 108 to interconnect traces in the upper interconnect layers (M2 and above layers) through contact pads 124 and 125. As an example, contact pad 124 and an interconnect trace 210 are coupled through a direct connection by via1a, which is formed over and aligned with TSV 107. As another example, contact pad 125 is extended through a redistribution M1 feature 138, which is coupled to an interconnect trace 210 through via1b. In this example, via1b is not over and aligned with TSV 108. The various embodiments of the present invention are not limited to only direct connections between TSV contact pads and interconnect traces in the upper interconnect layers. It is also noted that vias are used to connect the interconnect traces in the various interconnect layers, but are not shown in FIG. 1F in order to simplify the illustration. Afterward, an isolation layer (also sometimes referred to as a passivation layer) 345 is deposited over wafer 10, which may provide mechanical and chemical protection to the devices and interconnect traces formed in wafer 10.

Figure 1G:
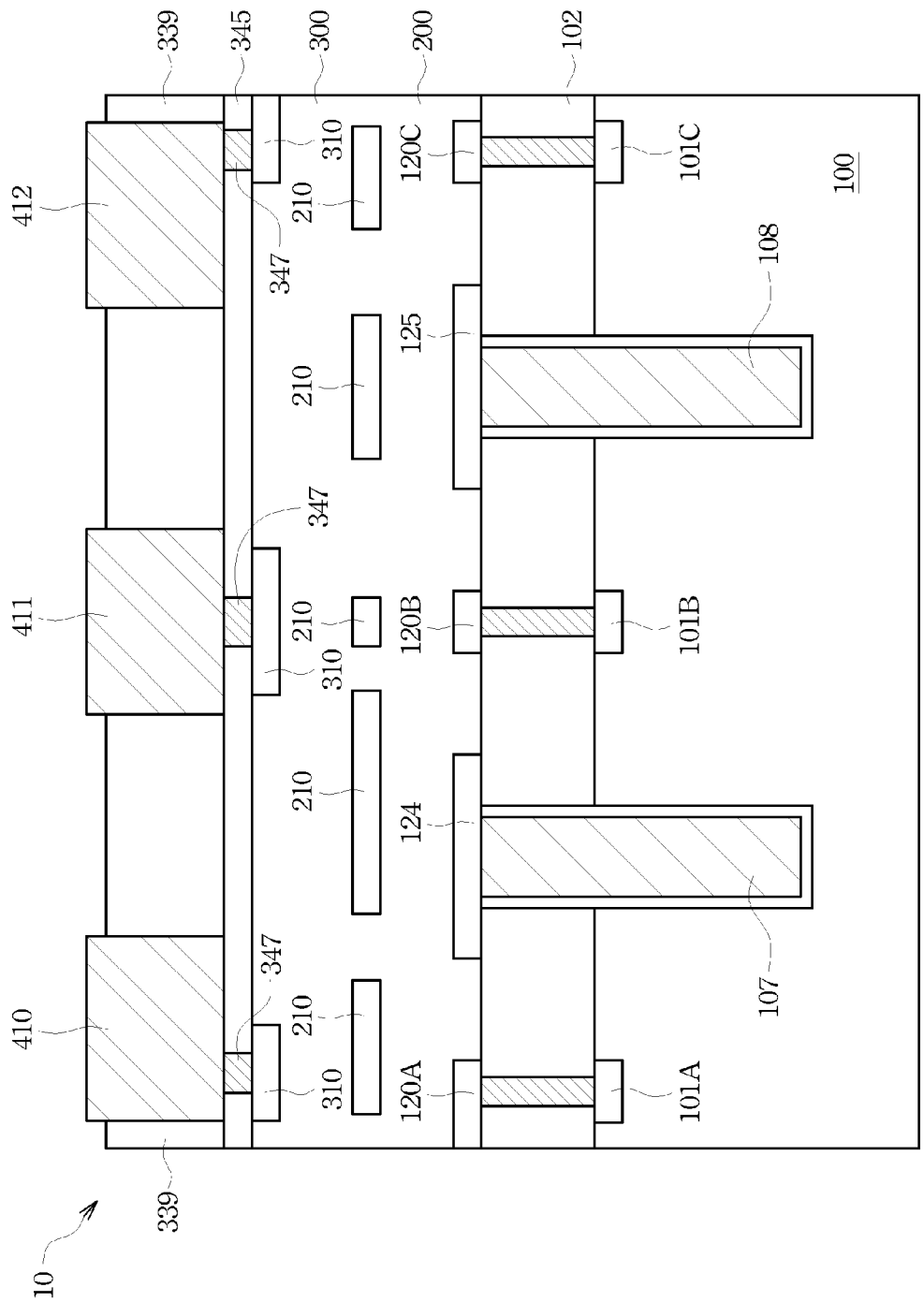

Bonding contacts 410, 411 and 412, as shown in FIG. 1G, are formed by depositing dielectric layer 339, which may insulate devices and interconnect traces in wafer 10 from any other circuitry or devices in any wafers bonded to wafer 10. Recesses are etched into dielectric layer 339 into which conducting material is deposited to form bonding contacts 410, 411 and 412. The insulation material making up dielectric layer 339 is removed or etched to reveal bonding contacts 410, 411 and 412 slightly elevated above the top of dielectric layer 339. Bonding contacts 410, 411 and 412 may be electrically coupled to conductive traces 310 through vias 347 in isolation layer 345.

Figure 2:
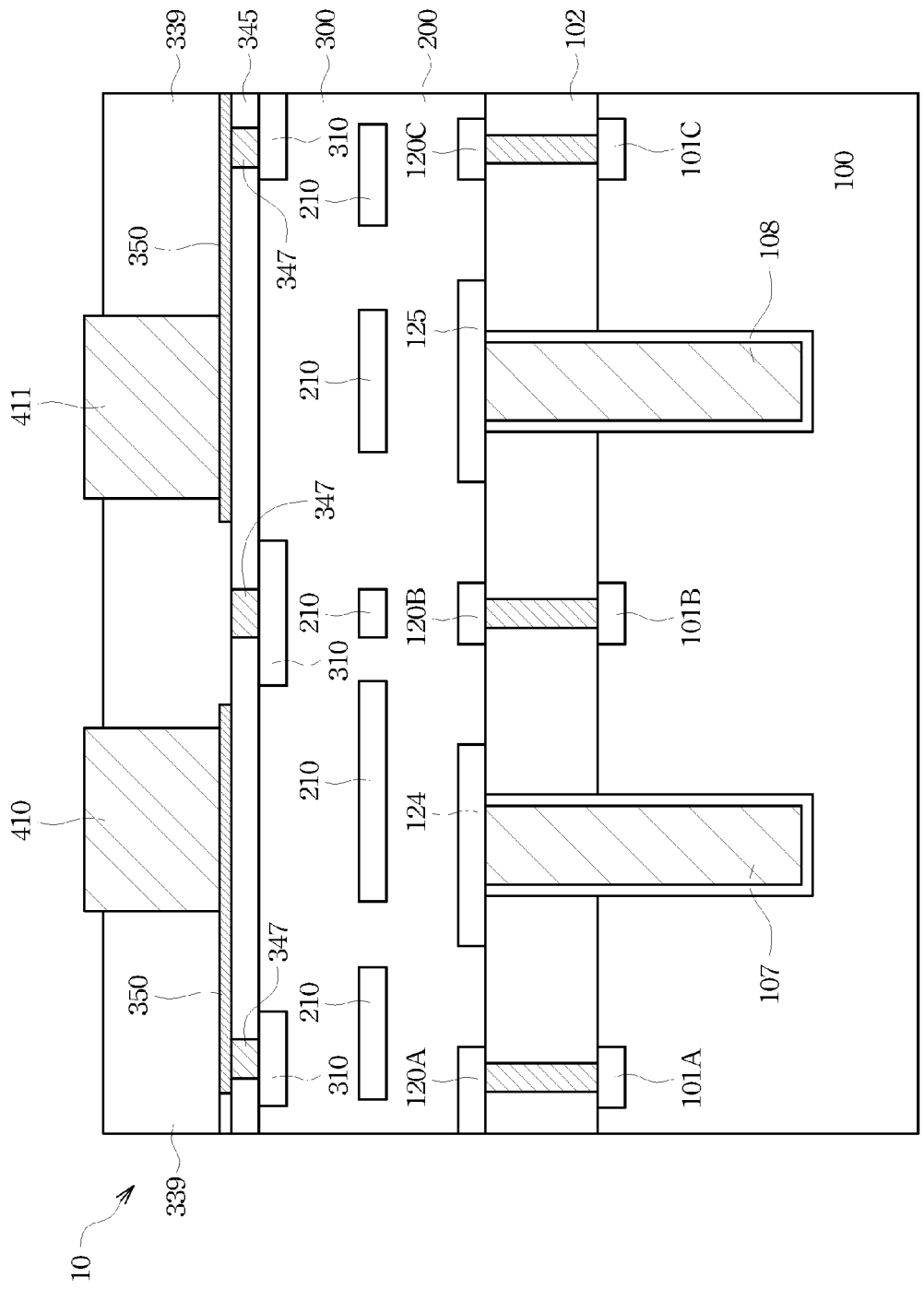
FIG. 2 is a cross-sectional view of a wafer having through vias formed in the substrate and dielectric layers according to one embodiment of the present invention.

It should be noted that bonding contacts 410, 411 and 412 are not limited to the positions in relation to conductive traces 310 in the top interconnect later, as illustrated in FIG. 1G. However, a connection between bonding contacts 410, 411 and 412 and conductive traces 310 should exist in some manner, such as a redistribution layer 350 (FIG. 2), conducting traces, or the like. The various embodiments of the present invention are not limited to only direct connection between bonding contacts and interconnect traces in the top interconnect layer.

Figure 1H:
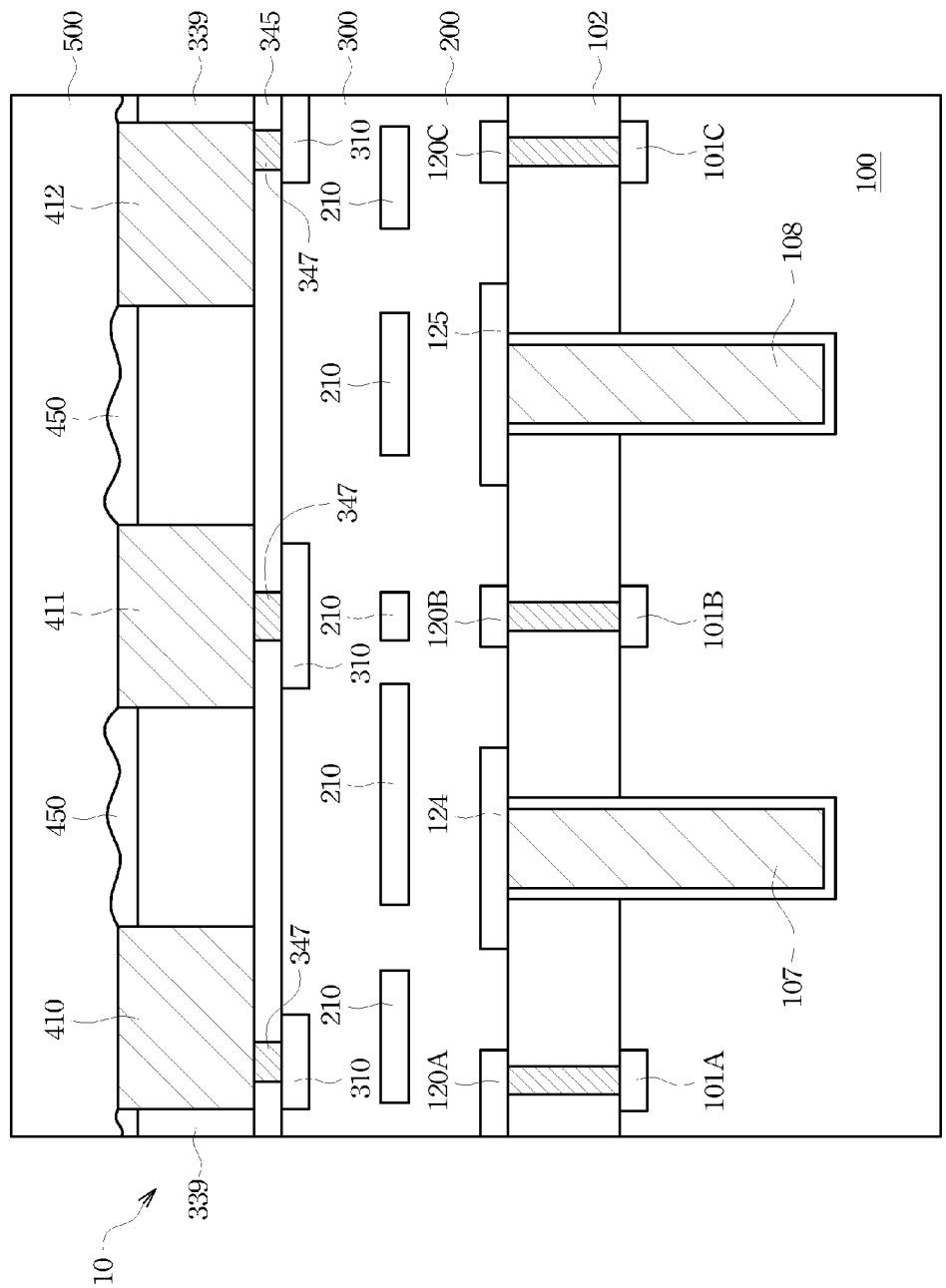

An adhesive 450 is applied to wafer 10, bonding wafer 10 to a wafer carrier 500, as shown in FIG. 1H. Carrier 500 is generally used to provide mechanical support in a subsequent process of thinning a back-side of substrate 100. In one preferred embodiment, carrier 500 may be a glass substrate or a raw silicon wafer having a thickness of 500-1000 microns.

Figure 1I:
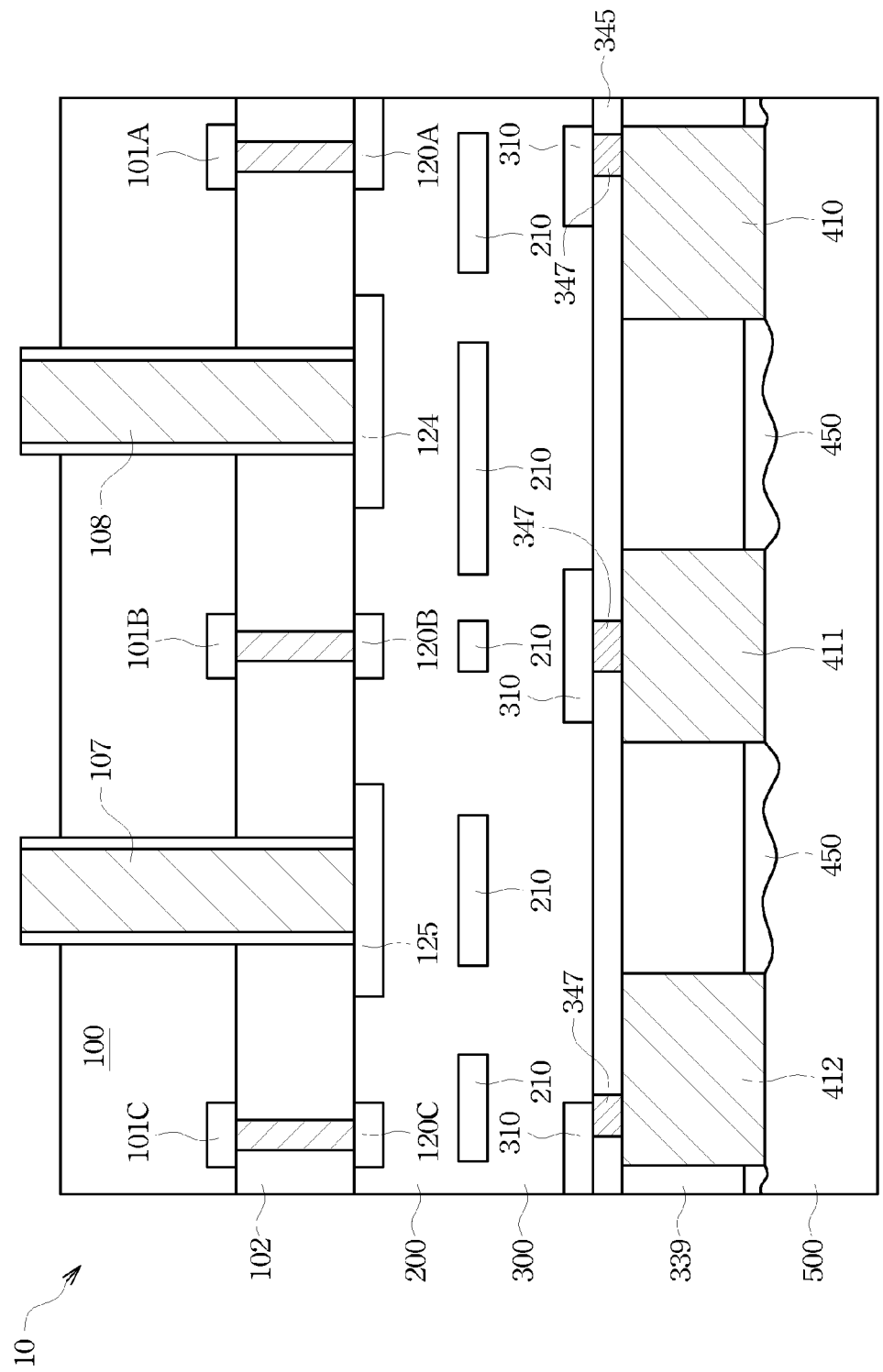

FIG. 1I is a cross-sectional view of wafer 10 according to one embodiment of the present invention. In order to provide back-side contact points for vias 107 and 108, wafer 10 is flipped, substrate 100 is thinned from a back-side, and portions of substrate 100 are removed through a process, such as etching, CMP, or the like, to reveal contact points with vias 107 and 108. In doing so, carrier 500 is attached to a wafer thinning handle jig, which is in turn attached to a wafer thinning mechanism. In removing such portions of substrate 100, vias 107 and 108 slightly protrude from substrate 100. After the substrate thinning process, the thickness of wafer 10 is reduced to a range of about 25 to about 250 microns.

Figure 1J:
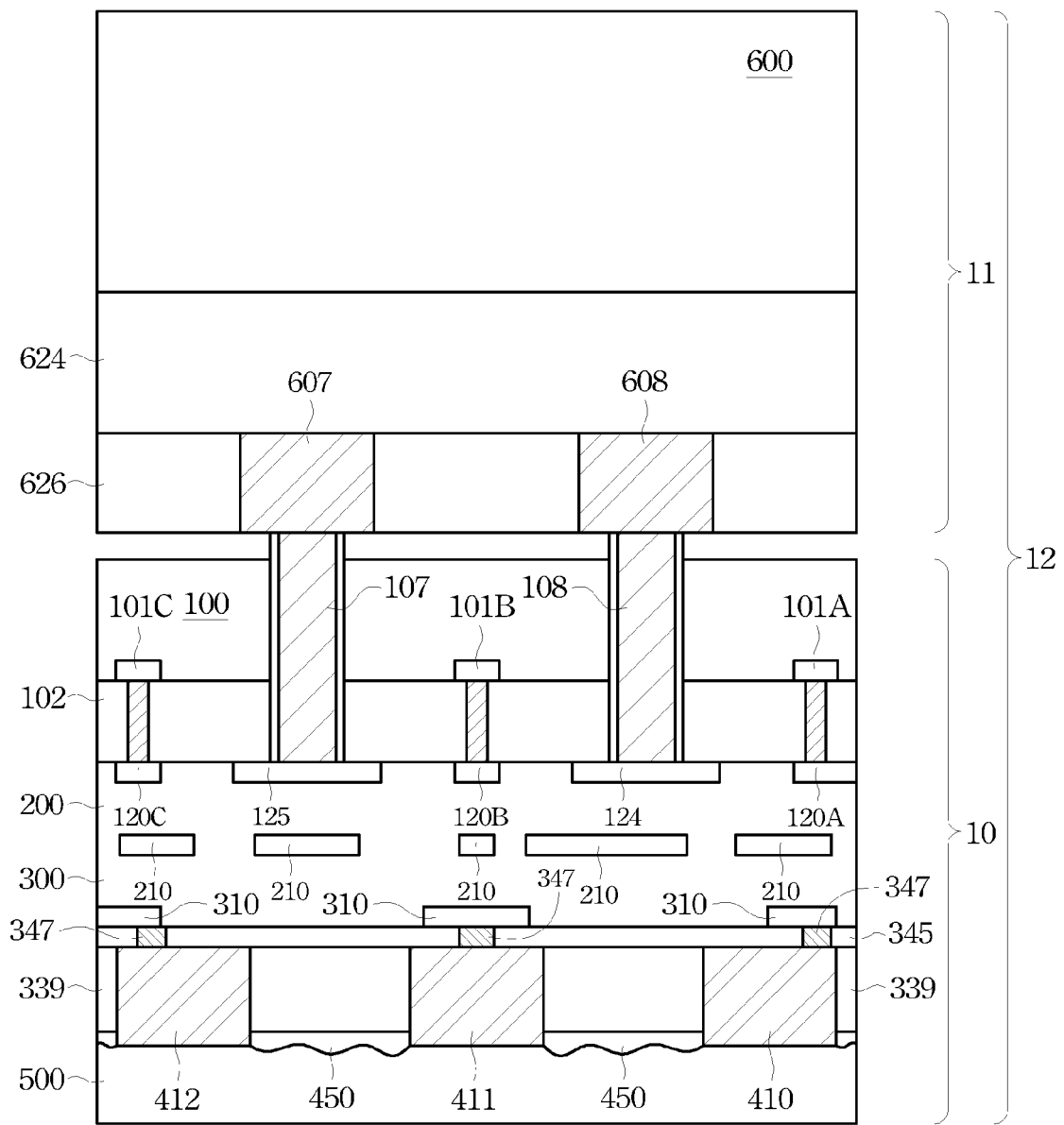

FIG. 1J illustrates the cross-section of wafer 10 stacked and bonded to wafer 11. Wafer 11 comprises substrate 600, dielectric layer 624, and insulating layer 626. Substrate 600 may comprise one or more pre-formed semiconductor devices. Dielectric layer 624 may be used to isolate interconnect traces formed in different interconnect layers, and insulating layer 626 may be used to limit interference between the various components on either wafer. Wafers 10 and 11 are aligned and bonded together at through via 107 and bonding pad 607, and at through via 108 and bonding pad 608 to form stacked wafer 12. A bonding medium, such as copper, tungsten, a copper-tin alloy, a gold-tin alloy, an indium-gold alloy, a lead-tin alloy, or the like, may be applied between the bonding contacts on the to-be-bonded wafers 10 and 11.

Figure 1K:
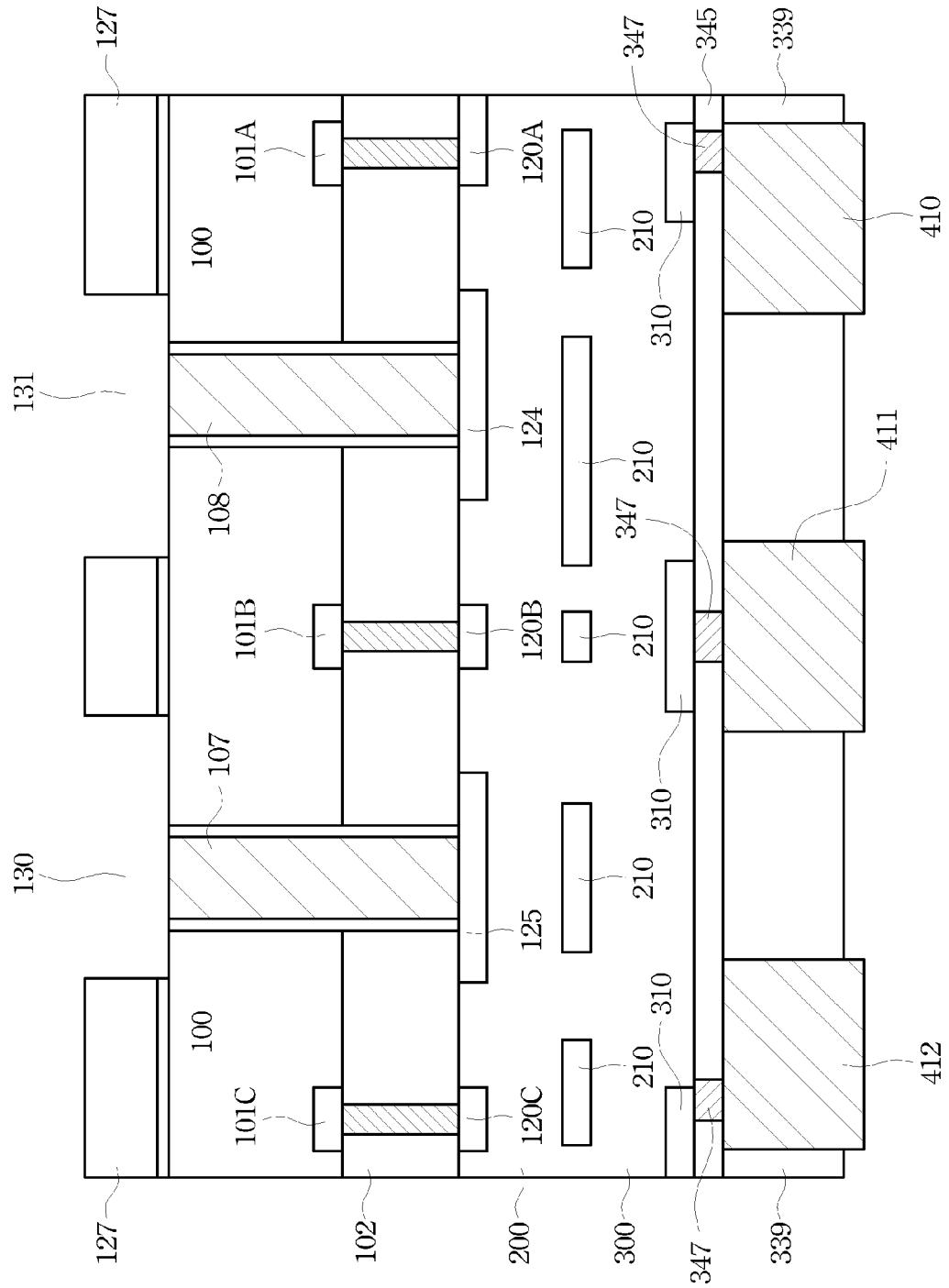
Figure 1L:
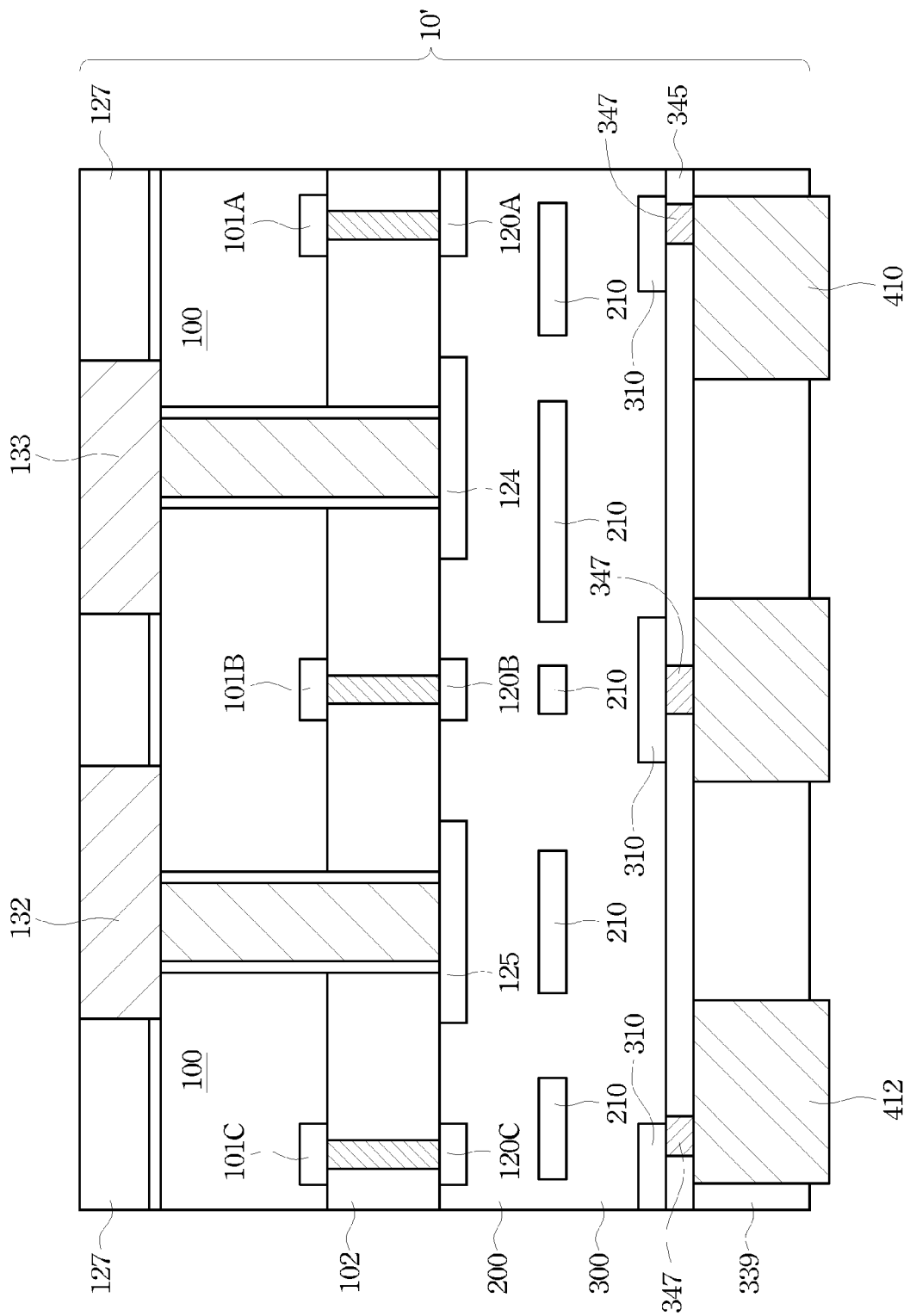

In another preferred embodiment, after the thinning process is performed on substrate 100 (FIG. 1I), carrier 500 is detached from wafer 10 and adhesive 450 is removed. Metallization insulator layer 127 is deposited onto a back-side of substrate 100 over the protruding edges of through vias 107 and 108, as shown in FIG. 1K. Metallization insulator layer 127 comprises layers of insulating material with a layer of liner material to prevent any metals deposited in the metallization process from leaching into wafer 10. Recesses 130 and 131 are then etched from metallization insulator layer 127. The metallization process results in the formation of bonding pads 132 and 133, as shown in FIG. 1L. A metal, such as copper, tungsten, aluminum, or the like, is deposited over metallization insulation layer 127, and the excess portions of metal are then etched or removed through etching or CMP, resulting in the formation of bonding pads 132 and 133. The wafer thus processed is indicated as wafer 10' in FIG. 1L.

Figure 1M:
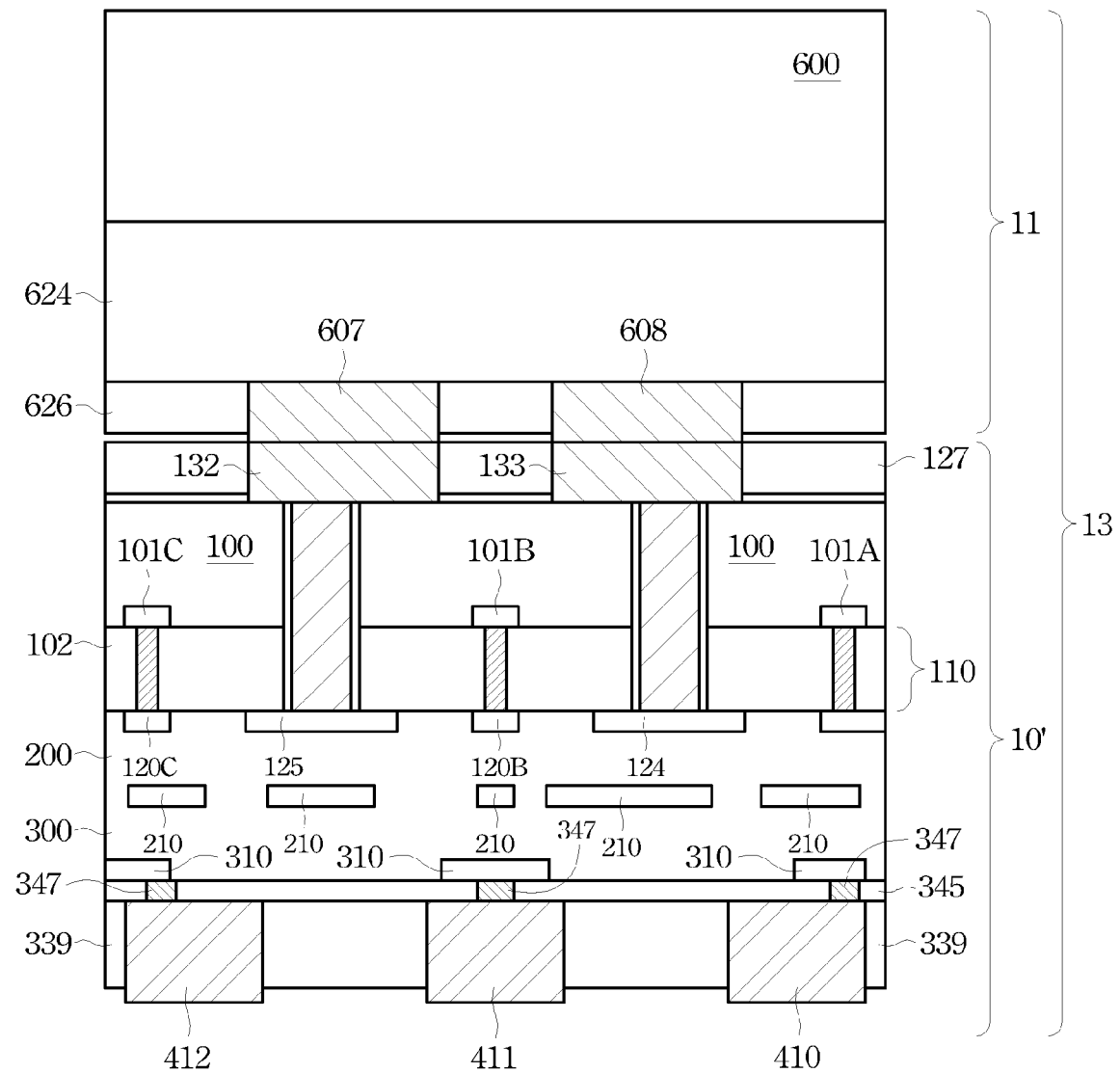

FIG. 1M illustrates the cross-section of wafer 11 stacked and bonded to wafer 10'. Wafer 11 comprises substrate 600, dielectric layer 624, and insulating layer 626. Substrate 600 may comprise one or more pre-formed semiconductor devices, dielectric layer 624 may be used to isolate interconnect traces formed in different interconnect layers, and insulating layer 626 may be used to limit interference between the various components on either wafer. Wafers 11 and 10' are aligned and bonded together at bonding pads 607-132 and 608-133 to form stacked wafer 13. A bonding medium, such as copper, tungsten, a copper-tin alloy, a gold-tin alloy, an indium-gold alloy, a lead-tin alloy, or the like, is applied between the bonding contacts on the to-be-bonded wafers 10' and 11.

It should be noted that, although wafers 10, 10' and 11 are illustrated to form a stacked wafer configuration, the specific wafers used herein are not intended to limit the embodiments of the present invention in any way. In practice, structures 10, 10' and 11 may be either a wafer or a die, thus the stacked structure may have a die-to-die bonding configuration, a die-to-wafer bonding configuration, or a wafer-to-wafer bonding configuration.

It should also be noted that any number of different devices, components, connectors, and the like may be integrated into wafers 10, 10' and 11. The specific devices or lack of devices that may be illustrated herein are not intended to limit the embodiments of the present invention in any way.

It should be further noted that only a limited number of active devices, such as devices 101A-101C, and vias, such as vias 107 and 108, are shown for the ease of illustration and clarity. However, those of ordinary skill in the art will appreciate that, in practice, the integrated circuitry associated with integrated circuits and stacked die may include millions or even tens of millions or more active devices and, further, that interconnect structures may include tens or even hundreds of conductors or more in the uppermost dielectric layers. Similarly, those of ordinary skill in the art will appreciate that each stacked die will, in practice, include dozens or more of backside connections, using conductive vias and leads. Also, stacked die structures in the preferred embodiments may include dozens or even hundreds or more of bonding contacts for making electrical connection to an IC package, for example, although only three bonding contacts 410-412 are shown.

Figure 3:
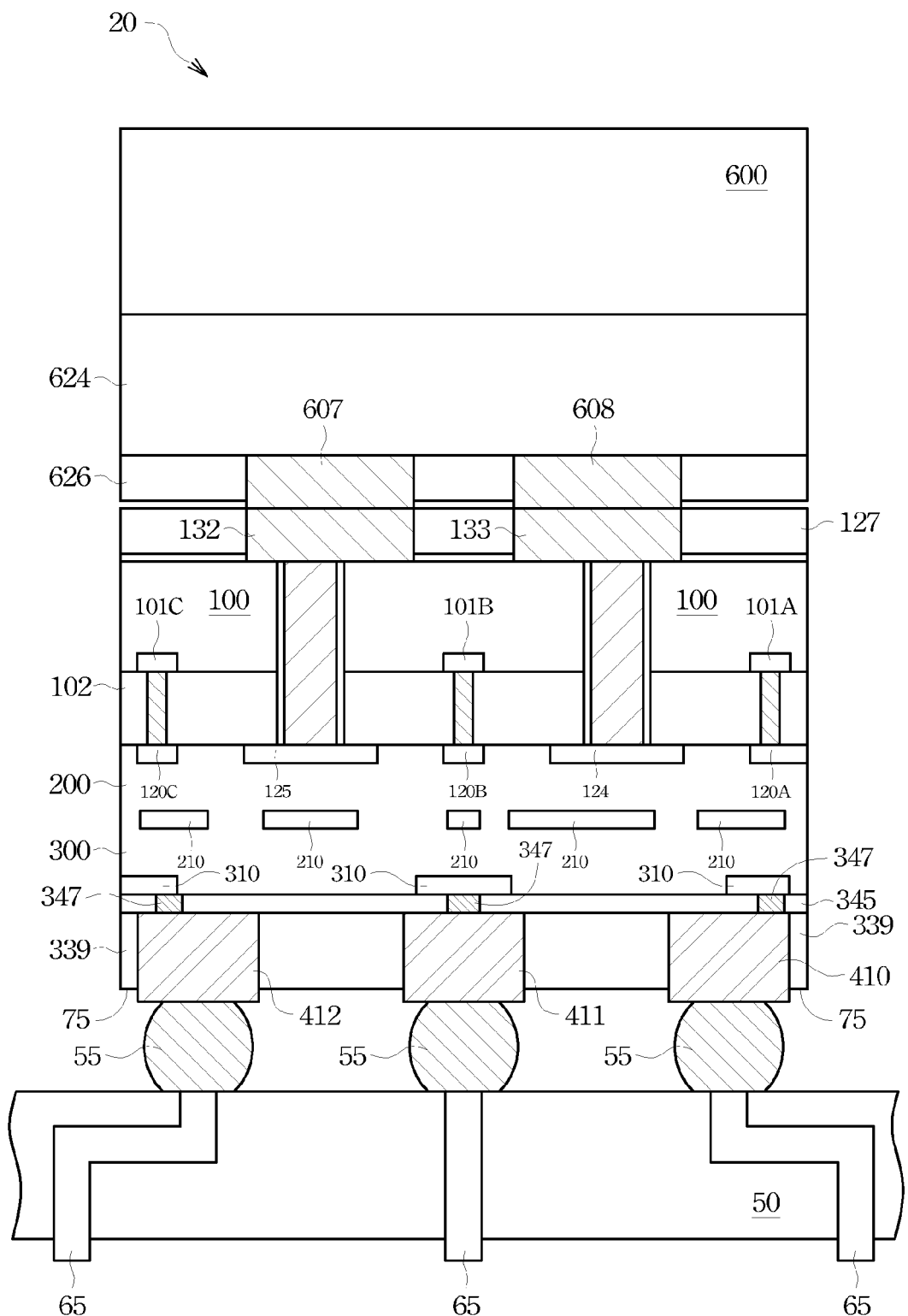
FIG. 3 is a cross-sectional view of a wafer having through vias formed in the substrate and dielectric layer according to one embodiment of the present invention.

FIG. 3 illustrates the cross-section of IC package 20 in a flip-chip ball grid array (BGA) configuration, which includes stacked dies of preferred embodiments, such as stacked dies 12 (FIG. 1J) or 13 (FIG. 1M). After the formation of stacked dies 12 or 13, a large number of bonding contacts, such as 410-412, generally arranged in an array form are disposed on a bonding surface 75. Bonding surface 75 is attached to package substrate 50 through solder bumps (e.g., solder balls) 55, which in turn makes an electrical connection to a printed circuit board (not shown) through package leads 65. It is noted that other IC packaging schemes may be also used to package stacked dies in the preferred embodiments. As another example, the stacked dies may be solder-bonded directly to a printed circuit board. The specific devices or lack of devices that may be illustrated herein are not intended to limit the embodiments of the present invention in any way.

It should be noted that each of the example wafers and dies described and illustrated above are meant to provide alternative implementations of vias, contact pads, and bonding pads that may be used with various embodiments of the present invention. In an additional and/or alternative embodiment of the present invention, any combination of the illustrated options may be used. The illustrated embodiments are not intended to limit the implementation of the various additional and/or alternative embodiments of the present invention.

It should further be noted that the different layers described in the illustrated embodiments may comprise various different materials depending on the desired function or availability that the manufacturer determines. The metals used for the metalized bonding pads may be any suitable metal or alloy, such as copper, tungsten, aluminum, aluminum-copper, and the like. Moreover, depending on the desired use or function of the different dielectric or insulating layers, any such dielectric materials may be used, such as silicon dioxide, silicon nitride, silicon carbide, silicon oxynitride, and the like. The present invention is not limited to use with only a certain limited number of compounds and materials.

It should further be noted that the different layers and recesses in the illustrated embodiments may be deposited or created using any number of a variety of known processes. For example, creation of the various layers of oxides, dielectrics, or other layers may be accomplished through chemical vapor deposition (CVD), atomic layer deposition (ALD), or the like. Moreover, removing material from the wafer may be accomplished through dry or wet etching, chemical mechanical polishing CMP), or the like. The present invention is not limited to any single such method.

Figure 4:
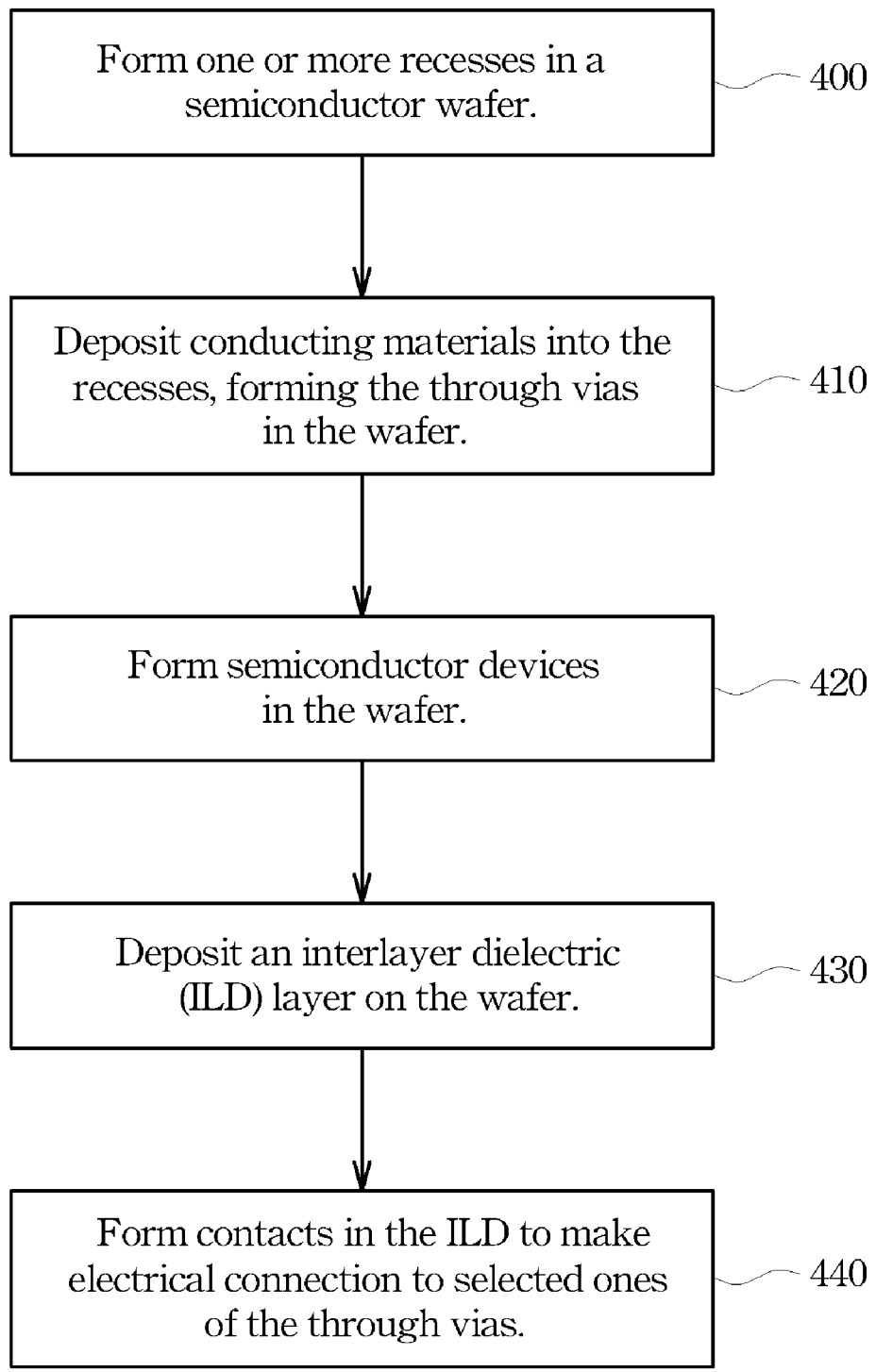
FIG. 4 is a flowchart illustrating example steps executed to implement one embodiment of the present invention.

FIG. 4 is a flowchart illustrating example steps executed to implement one embodiment of the present invention. In step 400, one or more recesses are formed in a first wafer prior to formation of semiconductor devices in the wafer. The recesses extend from a front-side surface of the wafer to a predetermined distance from a back-side surface of the wafer. Conductive material, such as copper, tungsten, aluminum, or the like, is deposited into the recesses in step 410, the conductive material forming the through vias. In one preferred embodiment, the through vias have a dimension (e.g., diameter) from about 15 microns to about 35 microns and an aspect ratio from about 2:1 to about 3.3:1. The semiconductor devices (e.g., CMOS or bipolar devices or the like) are formed in the wafer, in step 420. In step 430, an ILD layer is deposited on the front-side surface of the wafer over the semiconductor devices and through vias, where the ILD layer is made from a material such as silicon dioxide, silicon nitride, silicon carbide, silicon oxynitride, or the like. In step 440, one or more contacts are formed in the ILD layer, where selected ones of the contacts have an electrical connection to selected ones of the through vias.

Figure 5:
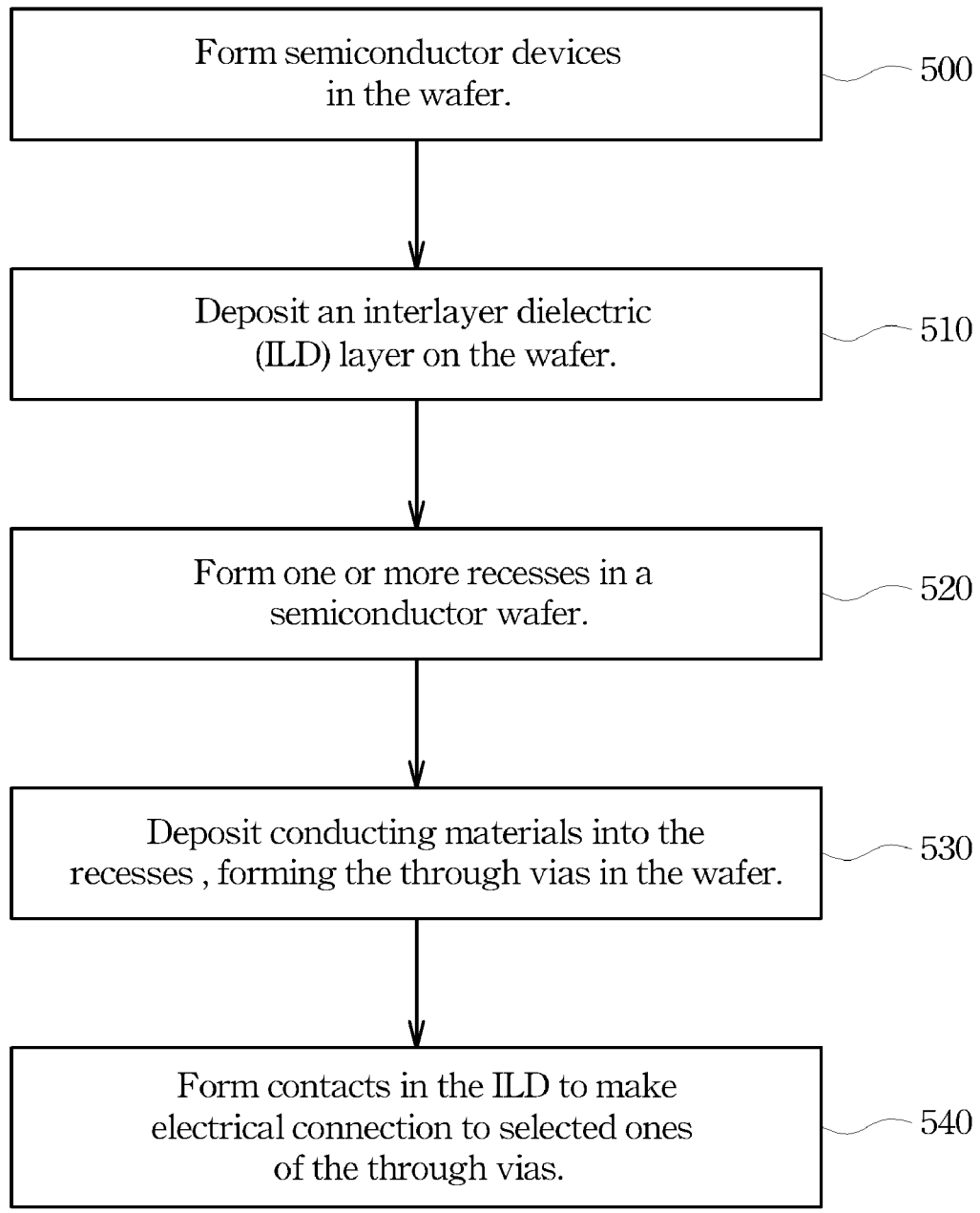
FIG. 5 is a flowchart illustrating example steps executed to implement one embodiment of the present invention.

FIG. 5 is a flowchart illustrating example steps executed to implement one embodiment of the present invention. In step 500, a plurality of semiconductor devices (e.g., CMOS devices) is formed on a front-side in a first semiconductor wafer. In step 510, an ILD layer is deposited on the front-side surface of the wafer over the semiconductor devices, where the ILD layer is made from a material such as silicon dioxide, PSG, silicon nitride, silicon carbide, silicon oxynitride, or the like. One or more recesses are formed in the semiconductor wafer in step 520. The recesses extend through the ILD layer and the front-side surface of the wafer to a predetermined distance from a back-side surface of the wafer. In step 530, conductive material, such as copper, tungsten, aluminum, or the like, is deposited into the recesses, forming through vias in the wafer. In one preferred embodiment, the through vias have a dimension (e.g., diameter) from about 15 microns to about 35 microns and an aspect ratio from about 2:1 to about 3.3:1. In step 540, one or more contacts are formed in the ILD layer, where selected ones of the contacts have an electrical connection to selected ones of the through vias.

Figure 6:
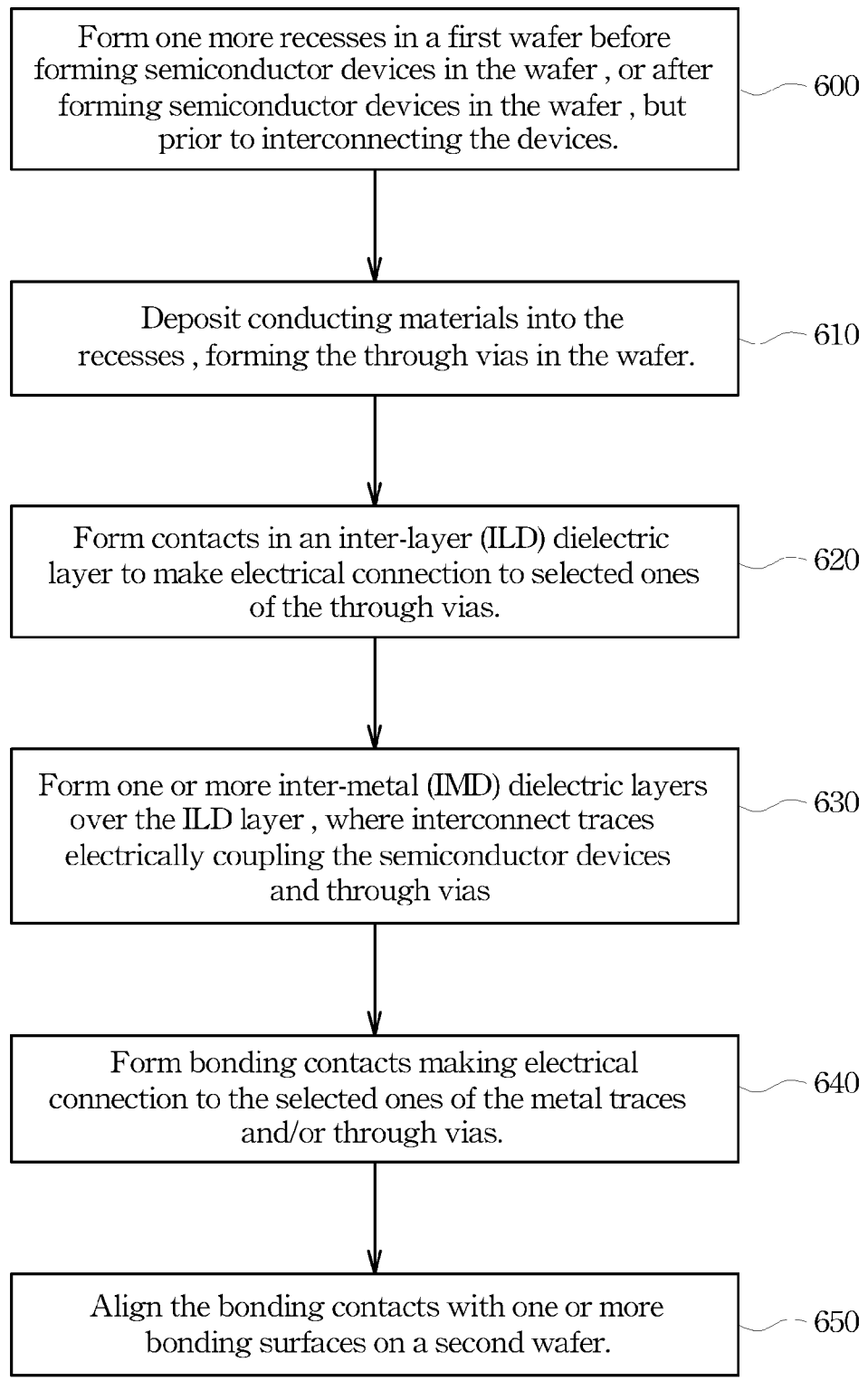
FIG. 6 is a flowchart illustrating example steps executed to implement one embodiment of the present invention.

FIG. 6 is a flowchart illustrating example steps executed to implement one embodiment of the present invention. In step 600, one or more recesses are formed in a first wafer prior to forming semiconductor devices in the wafer (e.g., FIG. 4), or after forming semiconductor devices in the wafer but prior to forming interconnect traces above the wafer connecting the semiconductor devices formed therein (e.g., FIG. 5). The recesses extend from a front-side surface of the wafer to a predetermined distance from a back-side surface of the wafer. Conductive material, such as copper, tungsten, aluminum, or the like, is deposited in step 610 into the recesses, the conductive material forming the through vias. In the current embodiment, the through vias have a dimension (e.g., diameter) from about 15 microns to about 35 microns and an aspect ratio from about 2:1 to about 3.3:1. In step 620, one or more contacts are formed in an ILD layer that is deposited on the front-side surface of the wafer, where selected ones of the contacts have an electrical connection to selected ones of the through vias. In step 630, one or more dielectric layers are deposited over the ILD layer and contacts. Metal traces are formed in the dielectric layers electrically coupling the semiconductor devices and through vias. In step 640, one or more bonding contacts are formed in the one or more dielectric layers, where the bonding contacts have an electrical connection to the selected ones of the metal traces and/or the through vias. In step 650, the one or more bonding contacts are aligned with one or more bonding contacts on one or more bonding surfaces on the second die or wafer in a stacked die-to-wafer or a wafer-to-wafer structure. A bonding medium, such as copper, tungsten, a copper-tin alloy, a gold-tin alloy, an indium-gold alloy, a lead-tin alloy, or the like, is applied between the bonding contacts on the to-be-bonded wafers. The stacked die-to-wafer or stacked wafer-to-wafer structures may be subsequently diced and packaged, where the one or more bonding contacts are coupled to an IC package through solder bumps, which in turn makes electrical connection to a printed circuit board through package leads.

Figure 7:
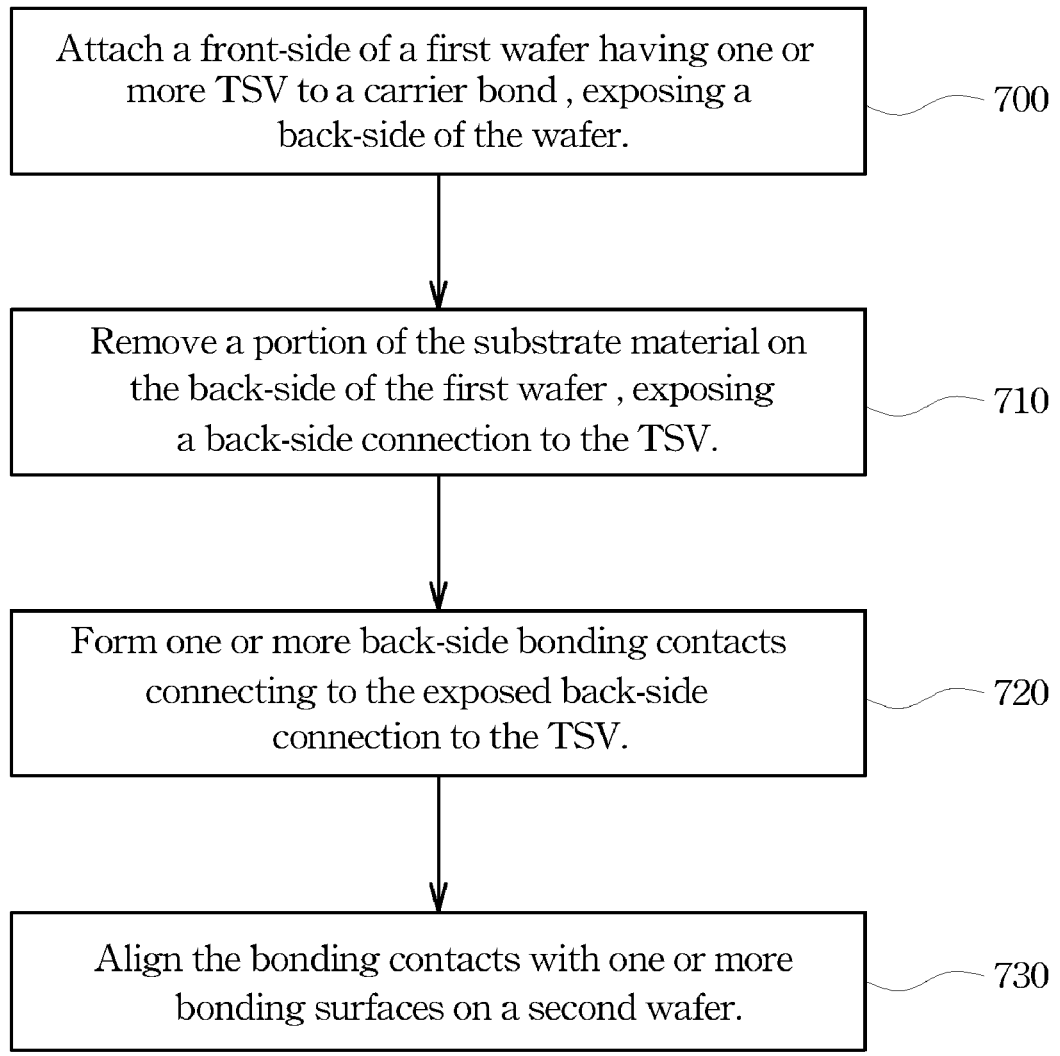
FIG. 7 is a flowchart illustrating example steps executed to implement one embodiment of the present invention.

FIG. 7 is a flowchart illustrating example steps executed to implement one embodiment of the present invention. In step 700, a front-side of a first wafer is attached to a carrier bond through adhesive, the first wafer having one or more through-silicon-via vias (TSVs). A portion of the substrate material on the back-side of the first wafer is removed in step 710 in order to expose a back-side connection to the TSV. One or more back-side bonding contacts are created in step 720 that are electrically connected to the exposed back-side connection to the TSV. The back-side bonding contacts of the first wafer are aligned and bonded with the bonding contacts of an additional wafer in step 730, using a material such as copper, tungsten, gold, copper-tin alloy, gold-tin alloy, indium-gold alloy, lead-tin alloy, or the like, that is electrically compatible with the bonding contacts.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a stacked integrated circuit (IC) semiconductor die comprising:

forming one or more recesses in a first semiconductor wafer, the first semiconductor wafer having CMOS devices formed thereon;

filling the one or more recesses with conducting material to form one or more through-silicon vias in the first semiconductor wafer;

forming one or more bonding contacts on a front-side of the first semiconductor wafer;

attaching the front-side of the first semiconductor wafer to a carrier, exposing a back-side of the first semiconductor wafer, wherein the carrier provides mechanical support to the first semiconductor wafer in a subsequent back-side thinning process;

thinning the back-side of the first semiconductor wafer until the one or more through-silicon vias are exposed and slightly protrude the back-side; and aligning and bonding the one or more through-silicon vias with corresponding one or more bonding contacts on one or more bonding surfaces on a second semiconductor die or wafer.

2. The method of claim 1, wherein the one or more recesses have a diameter from about 3 microns to about 50 microns and an aspect ratio from about 12:1 to about 3:1.

3. The method of claim 1, further comprising:
forming one or more semiconductor devices in the first semiconductor wafer;
forming an inter-layer dielectric (ILD) layer on the first semiconductor wafer;
forming one or more contact pads in the ILD layer making electrical contact to the one or more through-silicon vias;
forming interconnect metal traces in an inter-metal dielectric (IMD) layer over the ILD layer, the metal traces being electrically connected to the one or more semiconductor devices and the one or more contact pads in the ILD layer; and
forming a top dielectric layer having the one or more bonding contacts, the one or more bonding contacts being electrically coupled to one or more of the metal traces.

4. The method of claim 3, wherein the one or more contact pads are coupled to the one or more through-silicon vias through a redistribution conductive layer.

5. The method of claim 3, wherein the step of forming one or more recesses precedes the step of forming the one or more semiconductor devices.

6. The method of claim 3, wherein the step of forming one or more recesses precedes the step of forming interconnect metal traces.

7. The method of claim 1, wherein the conducting material used to form the one or more through-silicon vias is selected from the group consisting of: copper, tungsten, aluminum, gold, silver, and combinations thereof.

8. The method of claim 1, wherein after the step of thinning, the first semiconductor wafer has a thickness of from about 15 microns to about 250 microns.

9. The method of claim 1, further comprising:
forming a metallization insulator layer on the back-side of the first semiconductor wafer after the step of thinning; and
forming second one or more bonding pads in the metallization insulator layer, wherein the second one or more bonding pads are electrically connected to the one or more through-silicon vias and slightly protrude the metallization insulator layer.

10. The method of claim 9, wherein the second one or more bonding pads are electrically coupled to the one or more through-silicon vias through a second redistribution conductive layer.

11. A method of fabricating a stacked integrated circuit (IC) semiconductor die comprising:
providing a first semiconductor wafer having one or more through-silicon vias formed in a substrate and having CMOS devices formed thereon;
attaching a front-side surface of the first semiconductor wafer to a carrier, exposing a back-side of the first semiconductor wafer, wherein the carrier provides mechanical support to the first semiconductor wafer in a subsequent back-side thinning;
thinning the back-side of the first semiconductor wafer until the one or more through-silicon vias are exposed and slightly protrude from the back-side;
forming one or more first bonding contacts in a metallization insulator layer over the thinned back-side of the first semiconductor wafer, the one or more first bonding contacts being electrically coupled to the one or more through-silicon vias;
providing a second semiconductor work-piece having one or more second bonding contacts on a bonding surface of the second semiconductor work-piece; and
aligning and bonding the one or more first bonding contacts on the first semiconductor wafer to the corresponding one or more second bonding contacts on the second semiconductor work-piece.

12. The method of claim 11, wherein the second semiconductor work-piece comprises a semiconductor wafer, and wherein the step of bonding results in a wafer-to-wafer bonding configuration.

13. The method of claim 11, wherein the second semiconductor work-piece comprises a semiconductor die, and wherein the step of bonding results in a die-to-wafer bonding configuration.

14. The method of claim 11, wherein the one or more through-silicon vias has a diameter from about 3 microns to about 50 microns and an aspect ratio from about 12:1 to about 3:1.

15. The method of claim 11, wherein after the step of thinning, the first semiconductor wafer has a thickness of from about 15 microns to about 250 microns.

16. The method of claim 11, wherein conducting material used to form the one or more through-silicon vias is selected from the group consisting of: copper, tungsten, aluminum, gold, silver, and combinations thereof.

17. The method of claim 11, further comprising:
forming one or more semiconductor devices in the first semiconductor wafer; and
forming one or more second bonding contacts on the front-side of the first semiconductor wafer, the one or more second bonding contacts being electrically coupled to the one or more semiconductor devices and the one or more through-silicon vias through one or more interconnect metal traces in an inter-metal dielectric (IMD) layer over the first semiconductor wafer.

18. The method of claim 17, wherein forming the one or more semiconductor devices in the first semiconductor wafer are performed after the formation of the one or more through-silicon vias.

19. The method of claim 17, wherein forming the one or more semiconductor devices in the first semiconductor wafer are performed prior to the formation of the one or more interconnect metal traces.

20. The method of claim 17, further comprising:
bonding the one or more second bonding contacts on the stacked integrated circuit die to an IC package substrate through a plurality of bumps in a flip-chip IC packaging configuration.

* * * * *